(12) United States Patent
Mahoney (10) Patent No.: US 9,983,370 B1
(45) Date of Patent: May 29, 2018

(54) PASSIVE HEAT SINK FOR A SMALL FORM FACTOR PLUGGABLE

(71) Applicant: CISCO TECHNOLOGY, INC., San Jose, CA (US)

(72) Inventor: William George Mahoney, Suwanee, GA (US)

(73) Assignee: Cisco Technology, Inc., San Jose, CA (US)

(*) Notice: Subject to any disclaimer, the term of this patent is extended or adjusted under 35 U.S.C. 154(b) by 81 days.

(21) Appl. No.: 15/163,544

(22) Filed: May 24, 2016

(51) Int. Cl.
| | |
|---|---|
| *H05K 7/20* | (2006.01) |
| *F28F 3/00* | (2006.01) |
| *G02B 6/42* | (2006.01) |
| *H05K 7/14* | (2006.01) |
| *F28F 3/02* | (2006.01) |
| *F28F 13/00* | (2006.01) |
| *F28D 21/00* | (2006.01) |

(52) U.S. Cl.
CPC .............. *G02B 6/4269* (2013.01); *F28F 3/00* (2013.01); *F28F 3/02* (2013.01); *G02B 6/42* (2013.01); *H05K 7/14* (2013.01); *H05K 7/2049* (2013.01); *H05K 7/20418* (2013.01); *F28D 2021/0029* (2013.01); *F28F 2013/006* (2013.01); *F28F 2275/08* (2013.01)

(58) Field of Classification Search
CPC .... H05K 7/20418; H05K 7/2049; H05K 7/14; G02B 6/42; F28F 3/02; F28F 3/00; F28F 2275/08; F28F 2013/006; F28D 2021/0029
See application file for complete search history.

(56) References Cited

U.S. PATENT DOCUMENTS

| | | | | |
|---|---|---|---|---|
| 6,811,326 B2* | 11/2004 | Keeble | ................. | G02B 6/4201 385/92 |
| 6,816,376 B2* | 11/2004 | Bright | ................. | G02B 6/4201 165/185 |
| 6,986,679 B1* | 1/2006 | Aronson | ................. | H01R 25/00 439/170 |
| 7,317,617 B2* | 1/2008 | Meadowcroft | ...... | G02B 6/4201 165/104.33 |
| 7,371,965 B2* | 5/2008 | Ice | ....................... | G02B 6/4201 174/50 |
| 7,529,094 B2 | 5/2009 | Miller | | |

(Continued)

*Primary Examiner* — Robert J Hoffberg
*Assistant Examiner* — Matt Dhillon
(74) *Attorney, Agent, or Firm* — Merchant & Gould P.C.

(57) ABSTRACT

Aspects of the embodiments are directed to an optics module including a top-side inner wall and a bottom-side inner wall. The optics module may include a receiving element for receiving a small form factor pluggable (SFP) device; a heat sink including a first portion, the first portion including a top side and a bottom side, the bottom side of the heat sink in contact with the receiving element; and a first springing element residing between the first portion of the heat sink and the top-side inner wall of the optics module, the first springing element configured to bias the top side of the first portion of the heat sink onto the receiving element. In some embodiments, the optics module also includes a thermal interface material residing between the bottom-side inner wall of the optics module and the second portion of the heat sink, the thermal interface material configured to establish a thermal conduction path between the bottom-side inner wall of the optics module and the heat sink.

20 Claims, 10 Drawing Sheets

(56) References Cited

U.S. PATENT DOCUMENTS

| | | | |
|---|---|---|---|
| 7,764,504 B2* | 7/2010 | Phillips | G02B 6/4246 165/80.2 |
| 7,794,241 B2* | 9/2010 | Bright | H01R 12/721 439/59 |
| 2005/0148223 A1* | 7/2005 | Shirk | G02B 6/4246 439/160 |
| 2005/0195565 A1* | 9/2005 | Bright | H05K 7/20418 361/688 |
| 2005/0195571 A1* | 9/2005 | Bulman-Fleming | H05K 7/20509 361/704 |
| 2006/0291171 A1* | 12/2006 | Ahrens | G02B 6/4292 361/716 |
| 2014/0160679 A1* | 6/2014 | Kelty | H05K 7/20672 361/700 |

* cited by examiner

PASSIVE HEAT SINK FOR A SMALL FORM FACTOR PLUGGABLE

FIELD

This disclosure is directed to passive heat sinks for small form factor packages.

BACKGROUND

Pluggable optics, such as small form factor pluggables (SFP) and 10 GB small form factor pluggables (XFP) can be cooled utilizing clip mounted heat sinks with forced air convection (fans). As fiber pushes out deeper in the network, these pluggable optics are finding their way into the outside plant. The outside plant often does not include fans, but rather relies directly on natural convection to cool the electronics. The pluggable optics have lower maximum temperature ratings then standard outside plant components.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts.

DETAILED DESCRIPTION

Aspects of the embodiments are directed to an optics module that includes a top-side inner wall and a bottom-side inner wall. The optics module may include a receiving element for receiving a small form factor pluggable (SFP) device and a heat sink. The heat sink may include a first portion, the first portion having a top side and a bottom side, the bottom side of the heat sink in contact with the receiving element. The optics module can include a first springing element residing between the first portion of the heat sink and the top-side inner wall of the optics module, the first springing element configured to push the top side of the first portion of the heat sink onto the receiving element.

Aspects of the embodiments are directed to a communications node. The communications node including a housing, the housing having an outer surface, the outer surface comprising at least one passive cooling element. The housing may also include an inner surface, the inner surface configured to receiving an optics module. The communications node may also include an optics module having a top-side inner wall and a bottom-side inner wall. The optics module including a receiving element for receiving a small form factor pluggable (SFP) device; a heat sink comprising a first portion, the first portion comprising a top side and a bottom side, the bottom side of the heat sink in contact with the receiving element; and a first springing element residing between the first portion of the heat sink and the top-side inner wall of the optics module, the first springing element configured to bias the top side of the first portion of the heat sink onto the receiving element. For example, for a spring element configuration, the spring can bias (e.g., push) the heat sink onto the receiving element and can push the heat sink away from the a top wall of the optics module. The optics module may include a bottom-side outer wall, the optics module further comprising at least one attachment element thermally coupled to the optics module inner wall, the heat sink forming a thermal conduction path between the SFP cage and the at least one attachment element on the bottom-side outer wall of the optics module. The optics module housing may be configured to receive the at least one attachment element at the inner surface and wherein the inner surface of the housing forms a conductive path between the at least one attachment element and the passive cooling elements on the outer surface of the housing.

In some embodiments, the heat sink comprises a second portion, and wherein the optics module comprises a second springing element residing between the top-side inner wall of the optics module and the top side of the first portion of the heat sink, the second springing element configured to bias the second portion of the heat sink onto the bottom-side inner wall of the optics element.

Some embodiments also include a thermal interface material residing between the bottom-side inner wall of the optics module and the second portion of the heat sink, the thermal interface material configured to establish a thermal conduction path between the bottom-side inner wall of the optics module and the heat sink.

In some embodiments, the second springing element configured to bias the second portion of the heat sink onto the thermal interface material.

In some embodiments, the thermal interface material comprises a thermally conductive material.

In some embodiments, the heat sink comprises an L shape, wherein the first portion of the heat sink is a first leg of the L shape and the second portion of the heat sink is a second leg of the L shape.

Some embodiments may also include a thermal interface material residing between the heat sink and the bottom-side inner wall of the optics module, and wherein the first springing element configured to bias the heat sink onto the thermal interface material.

Some embodiments may also include an SFP device residing in the receiving element. In some embodiments, the heat sink comprises a protrusion on the bottom side of the heat sink, the receiving element comprises a gap to receive the protrusion to contact the SFP device within the receiving element.

In some embodiments, the optics module comprises a bottom-side outer wall, the optics module further comprising at least one attachment element thermally coupled to the optics module inner wall, the heat sink forming a thermal conduction path between the SFP cage and the at least one attachment element on the bottom-side outer wall of the optics module.

In some embodiments, the springing elements comprise one of springs or rubber grommets or rubber bellows.

In some embodiments, the heat sink comprises one of copper or aluminum.

In some embodiments, the heat sink comprises a second portion, and wherein the optics module comprises a second springing element residing between the top-side inner wall of the optics module and the top side of the first portion of the heat sink, the second springing element configured to bias the second portion of the heat sink onto the bottom-side inner wall of the optics element.

Some embodiments may also include a thermal interface material residing between the bottom-side inner wall of the optics module and the second portion of the heat sink, the thermal interface material configured to establish a thermal conduction path between the bottom-side inner wall of the optics module and the heat sink.

In some embodiments, the second springing element configured to bias the second portion of the heat sink onto the thermal interface material.

In some embodiments, the thermal interface material comprises a thermally conductive material.

In some embodiments, the heat sink comprises an L shape, wherein the first portion of the heat sink is a first leg of the L shape and the second portion of the heat sink is a second leg of the L shape.

Some embodiments may also include a thermal interface material residing between the heat sink and the bottom-side inner wall of the optics module, and wherein the first springing element configured to bias the heat sink onto the thermal interface material.

Some embodiments may also include an SFP device residing in the receiving element. In some embodiments, the heat sink comprises a protrusion on the bottom side of the heat sink, the receiving element comprises a gap to receive the protrusion to contact the SFP device within the receiving element.

In some embodiments, the at least one passive cooling element can include at least one heat fin on the outer surface of the communications node housing.

In some embodiments, the small form factor (SFP) device is or includes a 10 gigabit SFP (XFP) device.

Using a combination of heat sink technology, the heat sink described herein can reduce thermal resistances at various interfaces to maximize the conduction path efficiency.

Figure 1:
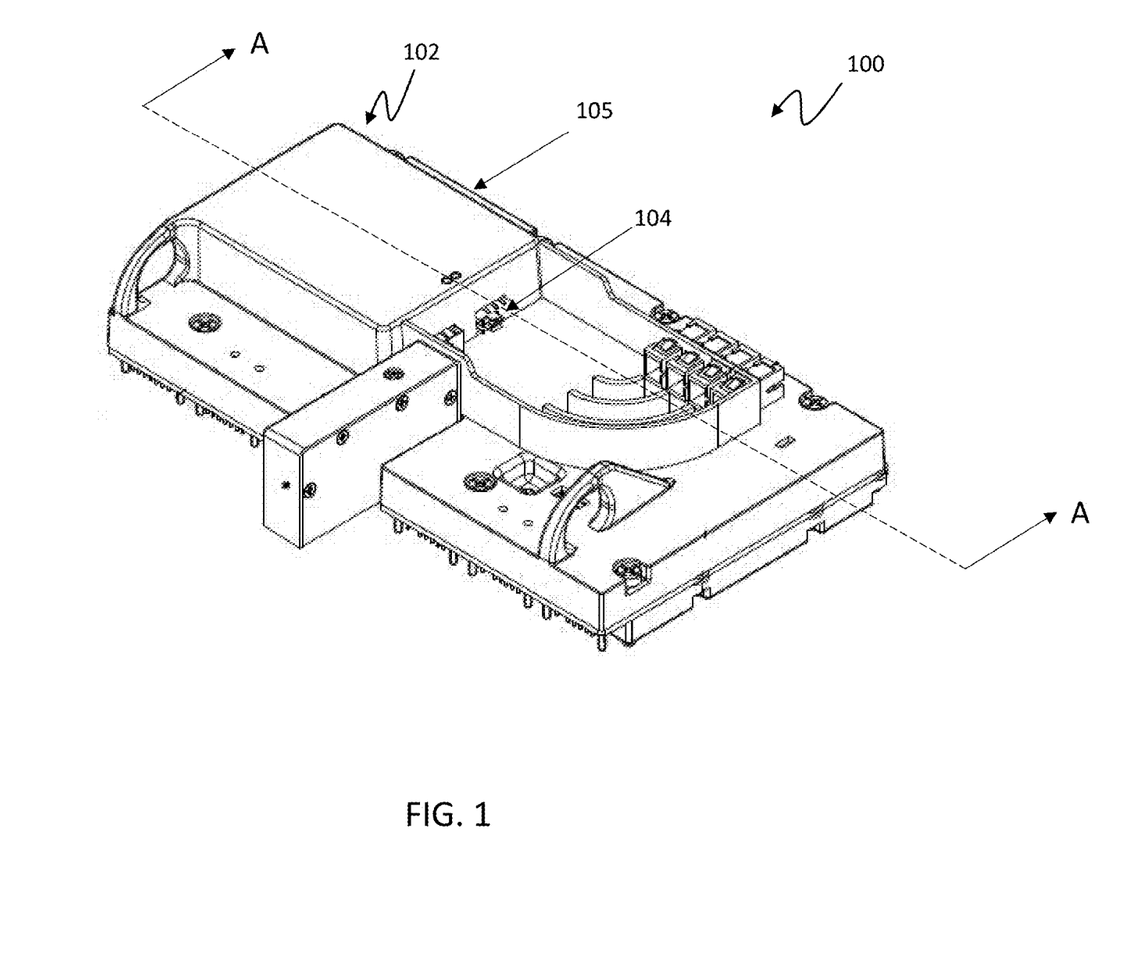
FIG. 1 is a schematic diagram of a perspective view of an optical module in accordance with embodiments of the present disclosure.

FIG. 1 is a schematic diagram of a perspective view of an optical module 100 in accordance with embodiments of the present disclosure. Optical module 100 can be a remote physical (RPHY) module. The term "physical" refers to the circuitry required to implement physical layer functions. A PHY connects a link layer device (often called MAC as an abbreviation for media access control) to a physical medium such as an optical fiber or copper cable. A PHY device typically includes a Physical Coding Sublayer (PCS) and a Physical Medium Dependent (PMD) layer. The PCS encodes and decodes the data that is transmitted and received. The purpose of the encoding is to make it easier for the receiver to recover the signal.

Optical module 100 can include an encasement 102 for housing a small form factor pluggable (SFP) or 10 gigabit SFP (XFP) device. The term SFP is used in this written description and in the claims to include either the SFP or the XFP. An SFP is a compact transceiver for both telecommunications and data communications. The form factor and electrical interface are specified by a multi-source agreement (MSA). The SFP interfaces a network device motherboard (for a switch, router, or similar device) to a fiber optic or copper networking cable.

The SFP device can interface with a daughter board on the optical module 100 through an SFP cage (the interface of which is shown as element 104 in FIG. 1). The optical module 100 can include a body 105 that houses various components of the optical module and the motherboard and daughterboard. The body 105 can also serve as a thermal conductor to transfer heat from the optical module 100 to the larger node that houses the optical module (shown in FIGS. 4A-4C). The module housing (e.g., SFP cage) that can receive and contain the pluggable optics resides within a weather tight enclosure 102. A cross section of the weather tight enclosure 102 (and other portions of the optics module 100) is shown in FIGS. 2A-2B.

Figure 2A:
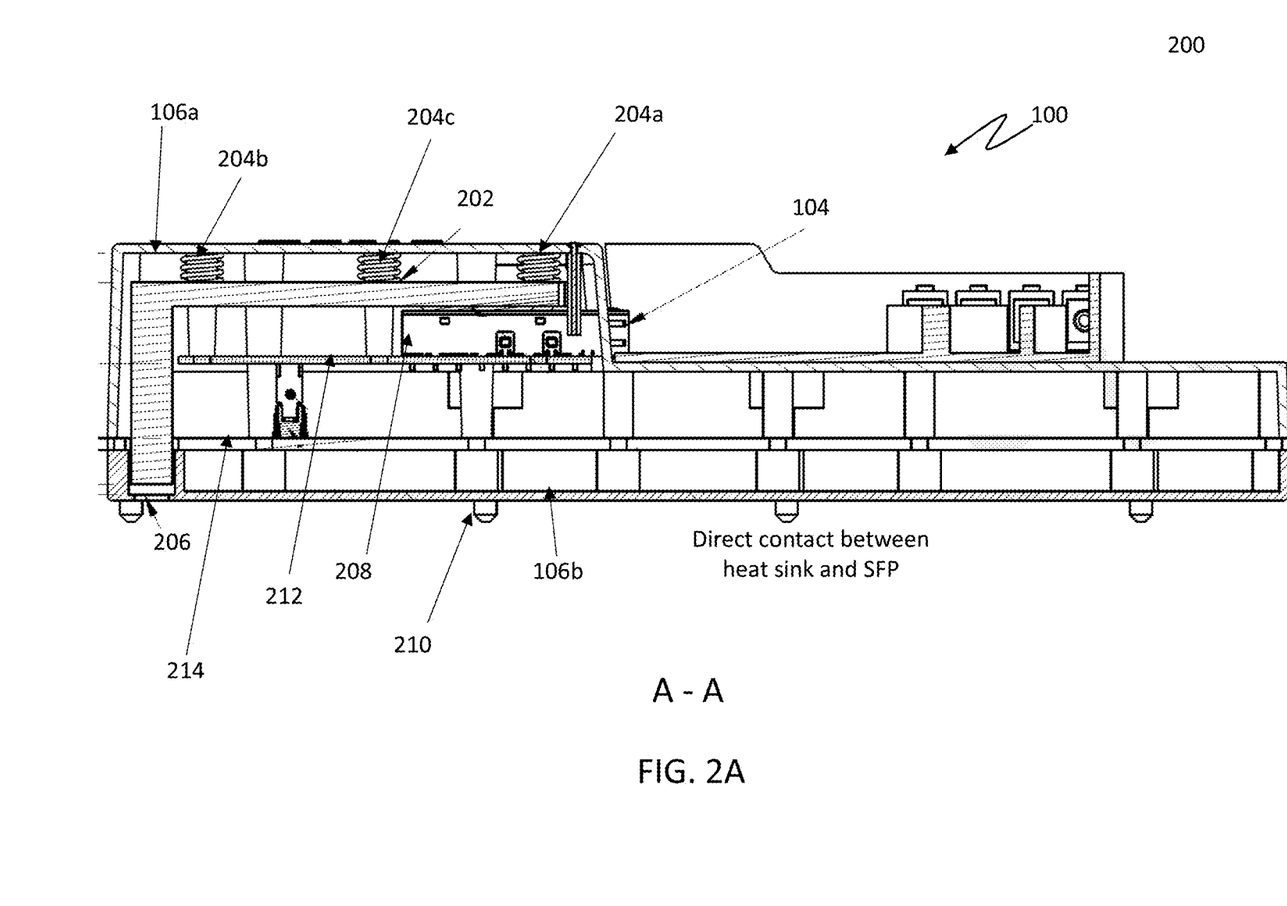
FIGS. 2A-2B are schematic diagrams of a cross-sectional view of the optical module of FIG. 1 in accordance with embodiments of the present disclosure.
Figure 2B:
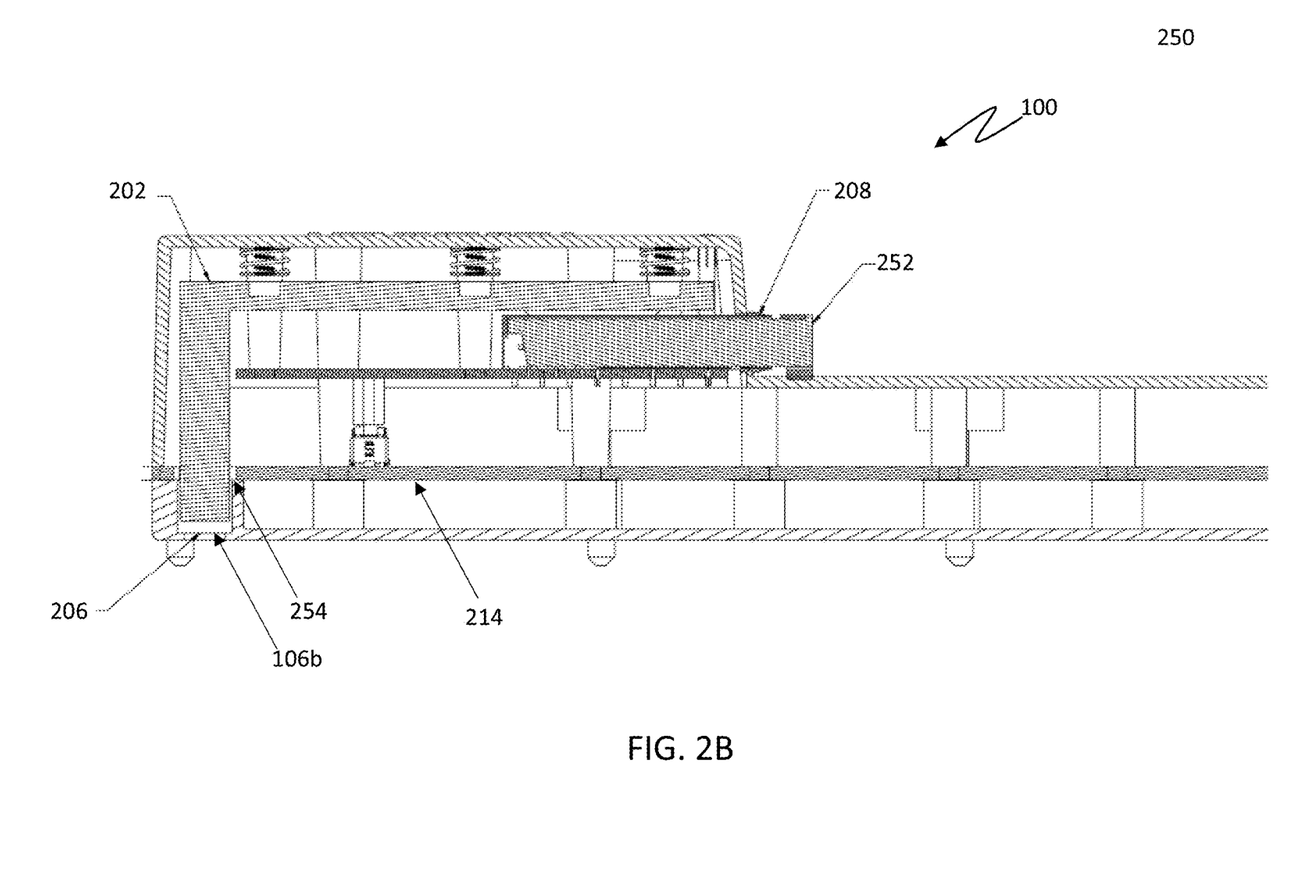

FIG. 2A is a schematic diagram 200 of a cross-sectional view of the optical module 100 of FIG. 1 in accordance with embodiments of the present disclosure. The optical module 100 includes an SFP cage 208 within an enclosure 102 that can receive an SFP module. The optical module 100 also includes a heat sink 202. The heat sink 202 can have an L-shaped form, which is described in more detail in FIGS. 3A-3B. The heat sink 202 (also called a heat spreader) can be copper or aluminum or other thermally conductive metal.

FIG. 2A shows the SFP cage 208 in contact with a daughter board 212. The daughterboard 212 can include circuit elements that electrically connect the SFP or XFP to the motherboard 214.

A first portion of the heat sink 202 is positioned in contact with a surface of the SFP cage 208. A second portion of the heat sink 202 can be in contact with the bottom portion of the optical module body 106b. In some embodiments, a thermal interface material 206 can be disposed between the heat sink 202 and the bottom portion of the optical module body 106b.

The thermal interface material 206 can be a thermally conductive material that thermally couples the heat sink to the bottom portion of the optical module body 106b. Additionally, the thermal interface material 206 can be formed or chosen to have spatial dimensions to relieve the strict tolerances for the heat sink to fit within the encasement 102 while also thermally coupling to the SFP cage 208. This thermal interface material 206 can have a low durometer so that when compressed it does not impact the above forces of the compression springs 204a, 204b, etc., biasing (e.g., pushing) the heat sink 202 into the SFP cage 208.

Figure 3A:
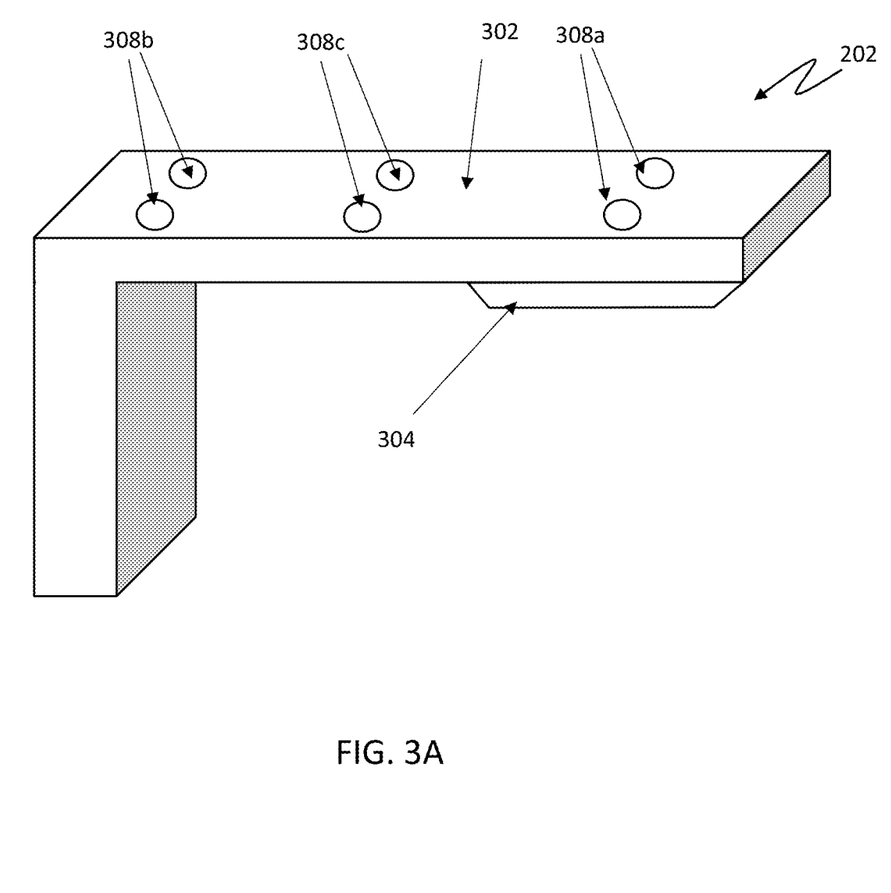
FIGS. 3A-3B are schematic diagrams of a heat sink in accordance with embodiments of the present disclosure.

Springs can be mounted on four corners of the heat sink 202 to provide the necessary spring rate distributed evenly downward onto SFP between the remote physical (RPHY) module housing (shown in FIGS. 4A-C) and the heat sink 202. Springs 204a and 204b can be disposed between the heat sink 202 and the module body 105 to provide a constant force driving the heat sink 202 into the SFP cage 208. For example, a spring 204a can be disposed between a) a portion of the heat sink 202 that is in contact with the cage 208 and b) an inner wall on a top side of the optical module body 106a. Spring 204a can bias (e.g., push via spring tension) on the heat sink 202 to force the heat sink 202 onto the cage 208 to thermally couple the heat sink 202 with the cage 208. Possible spring contact locations are shown in FIG. 3A.

In some embodiments, a rubber grommet or rubber bellows can be used as a springing element.

In some embodiments, a spring 204b can push on the heat sink 202 in a second, different location than spring 204a. Spring 204b can push the heat sink 202 to thermally couple the heat sink 202 to the bottom of the body 106b. In some embodiments, the spring 204b can push the heat sink 202 onto the thermal interface material 206, and by extension, push the thermal interface material 206 onto the body 106b.

In some embodiments, additional springs, such as spring 204c, can be used to provide additional force and stability.

The heat sink 208 is "L" shaped so that a direct conductive path can make an approximately 90 degree turn towards the bottom of the module 100 (e.g., bottom of the body 106b) to gain access to the conductive cooling surface. In some embodiments, the access to the conductive cooling surface is through at least one screw 210 thermally coupled to the bottom of the body 106b of module 100.

FIG. 2B is a schematic diagram 250 of a cross-sectional view of the optical module 100 of FIG. 1 in accordance with embodiments of the present disclosure. In FIG. 2B, the SFP pluggable device 252 is shown to be inserted in the cage 208. In some embodiments, the spring 204a can push the heat sink 202 directly onto the SFP pluggable device 252. For example the heat sink 202 can include a protrusion that is shaped to fit within an opening of the cage 208. The spring 204a can push the protrusion down onto the SFP pluggable 252 itself, which can increase thermal conductivity efficiency.

As an example embodiment, the SFP cage 208 can include a cut out opening in the top surface of the cage 208 (e.g. in a location where the heat sink 202 could contact the SFP pluggable device directly). The heat sink 202 can include a protrusion that can engage the opening in the cage 208 to form a thermal conduction path directly between the SFP pluggable 252 and the heat sink 202.

The leg of the "L" shaped heat sink can pass through a notch 254 on the end of the Remote Physical printed circuit board (PCB, e.g., motherboard 214) so that the thermal resistance of the PCB does not impact the conductive path.

Due to tolerance considerations of all the pieces in the assembly, the thermal interface material 206 can be a pliable thermal pad, such as BERGQUIST VULTRASOFT™. The interface material 206 can be used at the interface of the bottom of the heat sink 202 and the bottom of the body 106b. The bottom of the body 106b can be the mounting surface to the node external housing module (shown in more detail in FIGS. 4A-4C, and can transfer heat to the node external housing module through at least one screw 210 and/or through direct contact with the node body.

In some embodiments, heat pipes can be used instead of a heat sink. A heat pipe that has extremely high conductivity compared to just solid metal can increase thermal conductivity between the SFP and the node.

A tight interface ensures a good conduction path and increase the efficiency of the cooling process. Use of the springs allows the pluggable optics to be inserted and removed while still maintaining the tight conduction interface.

If the internal ambient of the weather tight enclosure is low enough then the design can use a thermal gap pad in conjunction with the springs to conduct heat away from the pluggable optics modules and dissipate within the external enclosure. If the weather tight enclosure has a high internal ambient temperature then the design can be constructed so that the geometry will create a conduction path to the module mounting surface which is the weather tight enclosure inside surface. The weather tight enclosure has external fins to aid in the natural convection cooling process. Use of heat pipes can also be utilized in the case of higher power dissipation requirements.

Figure 3B:
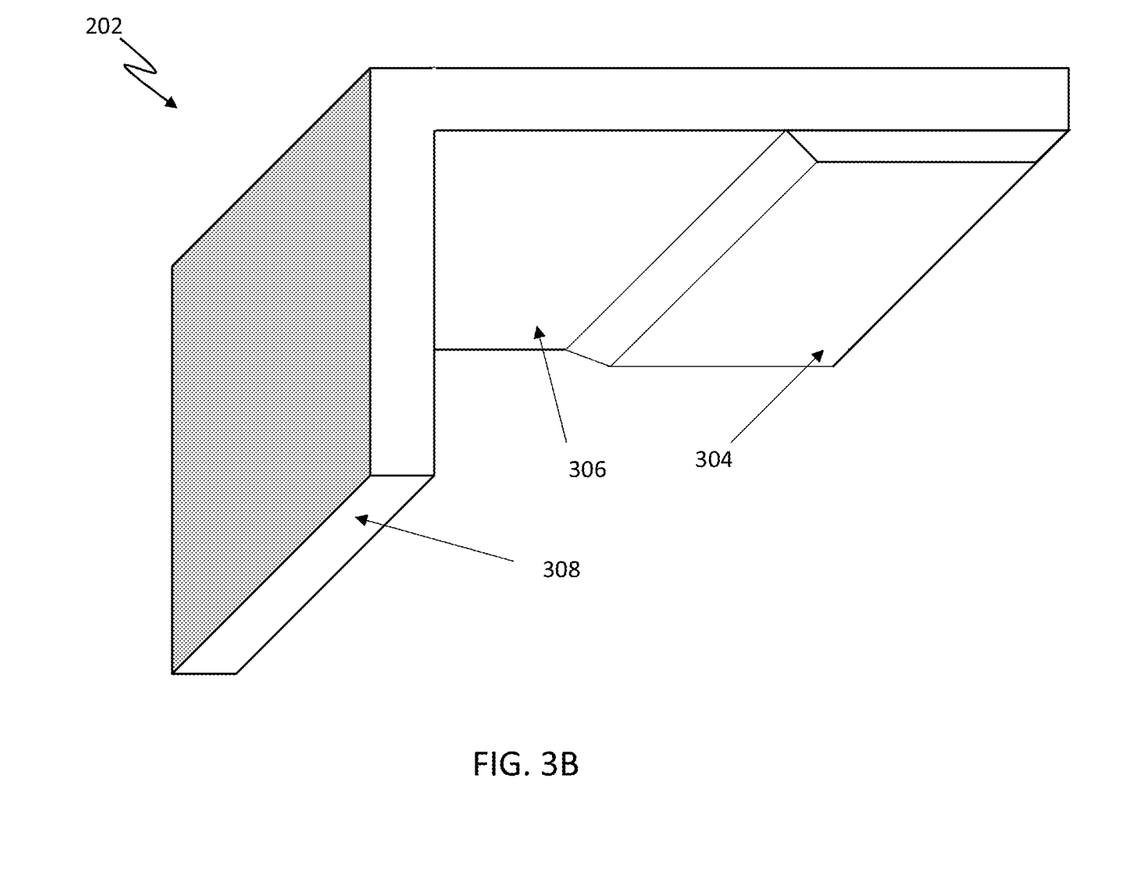

FIG. 3A-3B are schematic diagrams of a heat sink in accordance with embodiments of the present disclosure. FIG. 3A shows the L shaped heat sink 202. The heat sink 202 includes a top surface 302. Top surface 302 can include contact points for the springs to push the heat sink 202 onto the SFP, SPF cage, thermal interface material, and/or the bottom of module body 106b.

FIG. 3A illustrates example contact points for springs. For example, locations 308a illustrate two contact points where springs can push the heat sink 202 onto the SFP and/or SFP cage. Locations 308b illustrate two contact points where springs can push the heat sink 202 onto the thermal interface material and/or the bottom of module body 106b. Locations 308c illustrate optional additional contact locations that can add further pushing force and stability for the heat sink 202.

FIG. 3A also illustrates protrusion 304. Protrusion 304 can be shaped to fit within an opening in the SFP cage. The opening in the SFP cage can be an opening designed to receive clip-on heat sinks. The protrusion 304 is shaped to fit into the cage opening and contact the SFP body directly.

FIG. 3B illustrates the bottom of the heat sink 202. The protrusion 304 protrudes from a underside surface 306 of heat sink 202. The bottom surface 308 of the "L" shape of the heat sink 202 is also illustrated. This bottom surface 308 can contact the thermal interface material or can contact the bottom of the module body (element 106b from FIGS. 2A-2B).

Figure 3C:
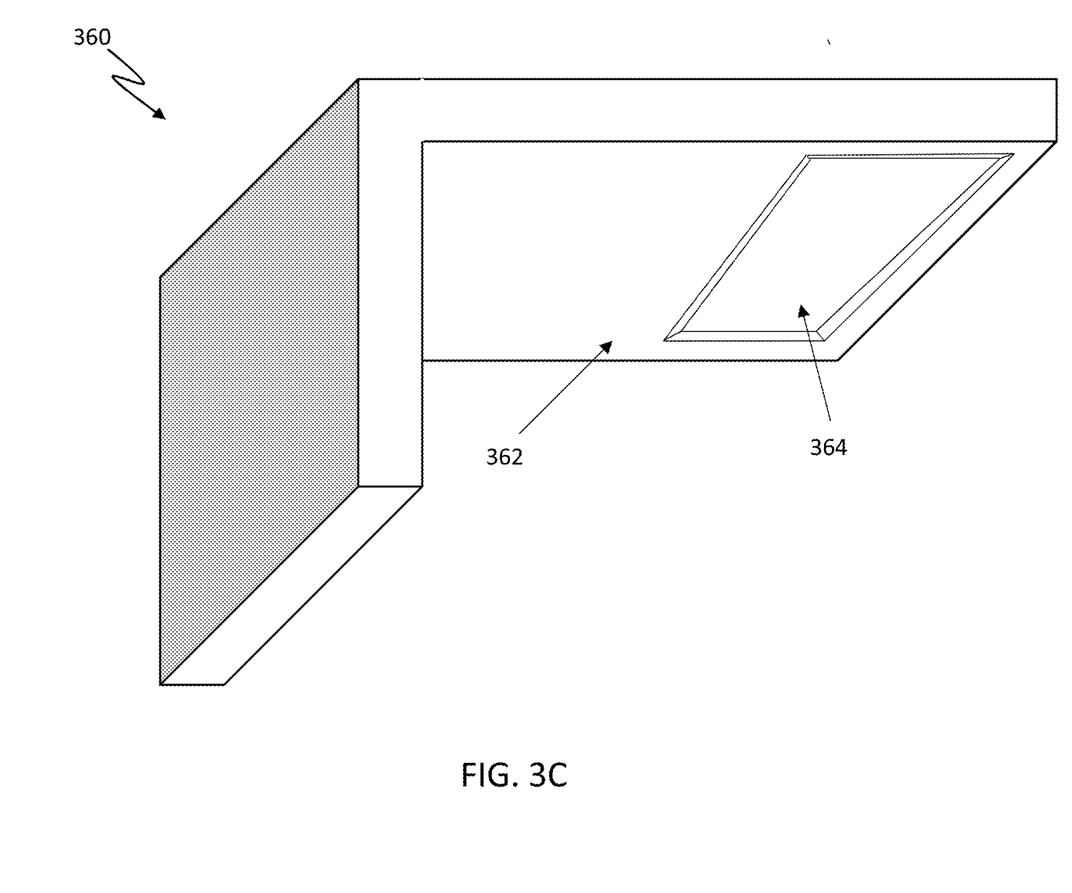
FIG. 3C is a schematic diagram of an example embodiment of a heat sink that includes an indentation on the bottom surface.

FIG. 3C is a schematic diagram of an example embodiment of a heat sink that includes an indentation on the bottom surface. Heat sink 360 is similar to that of heat sink 202. Heat sink 360 includes a bottom surface 362 (similar to bottom surface 308). Heat sink 360 includes an indentation 364. In some embodiments, the SFP body can protrude above the SFP cage. Heat sink 360 can include an indentation 364 that can accommodate the SFP body without damaging the SFP body, while still maintaining the force on the SFP body that ensures a thermally conductive interface between the SFP body and the heat sink 360.

Figure 4A:
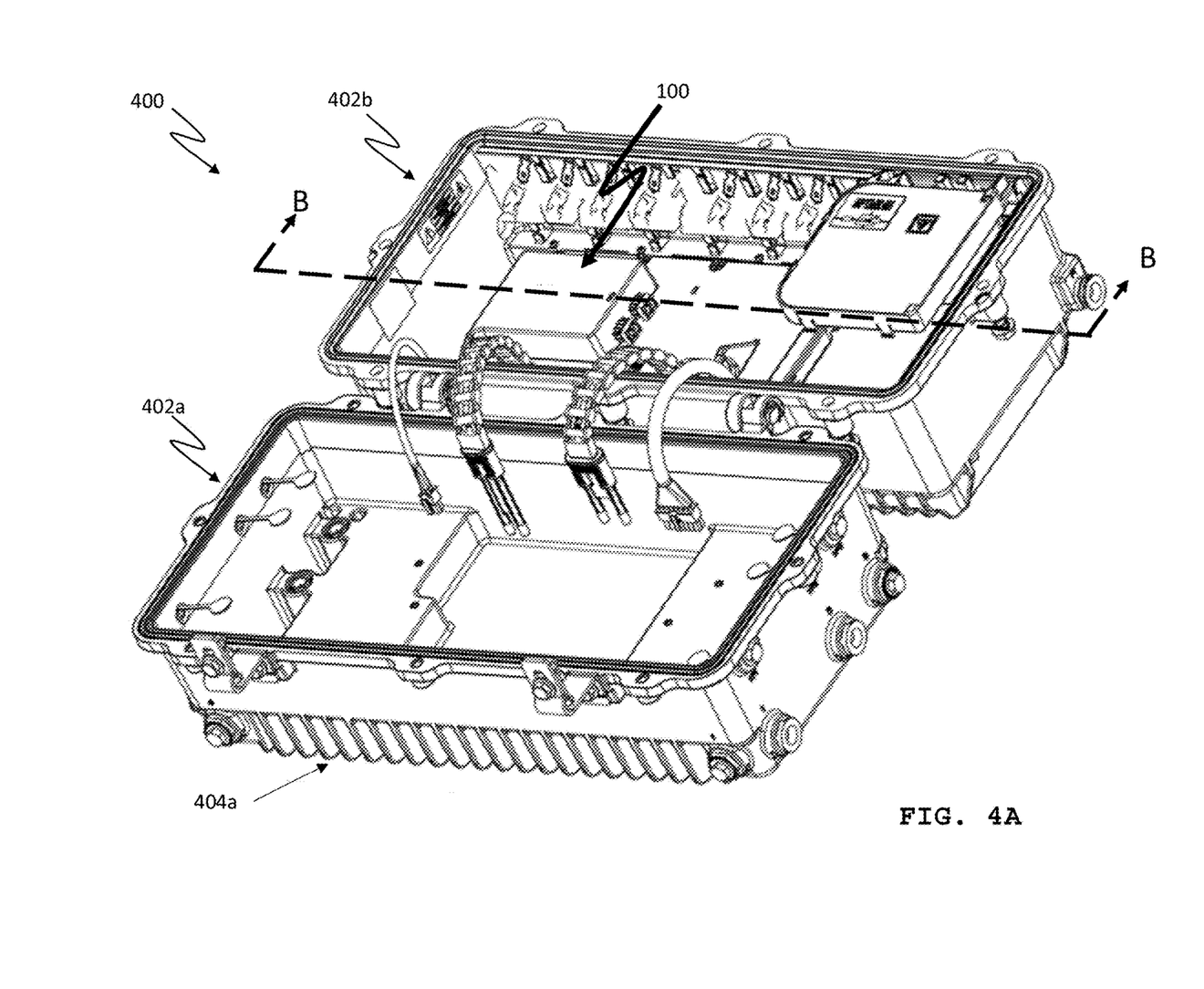
FIGS. 4A-4C are schematic diagrams of a communications node that includes an optical module in accordance with embodiments of the present disclosure.
Figure 4B:
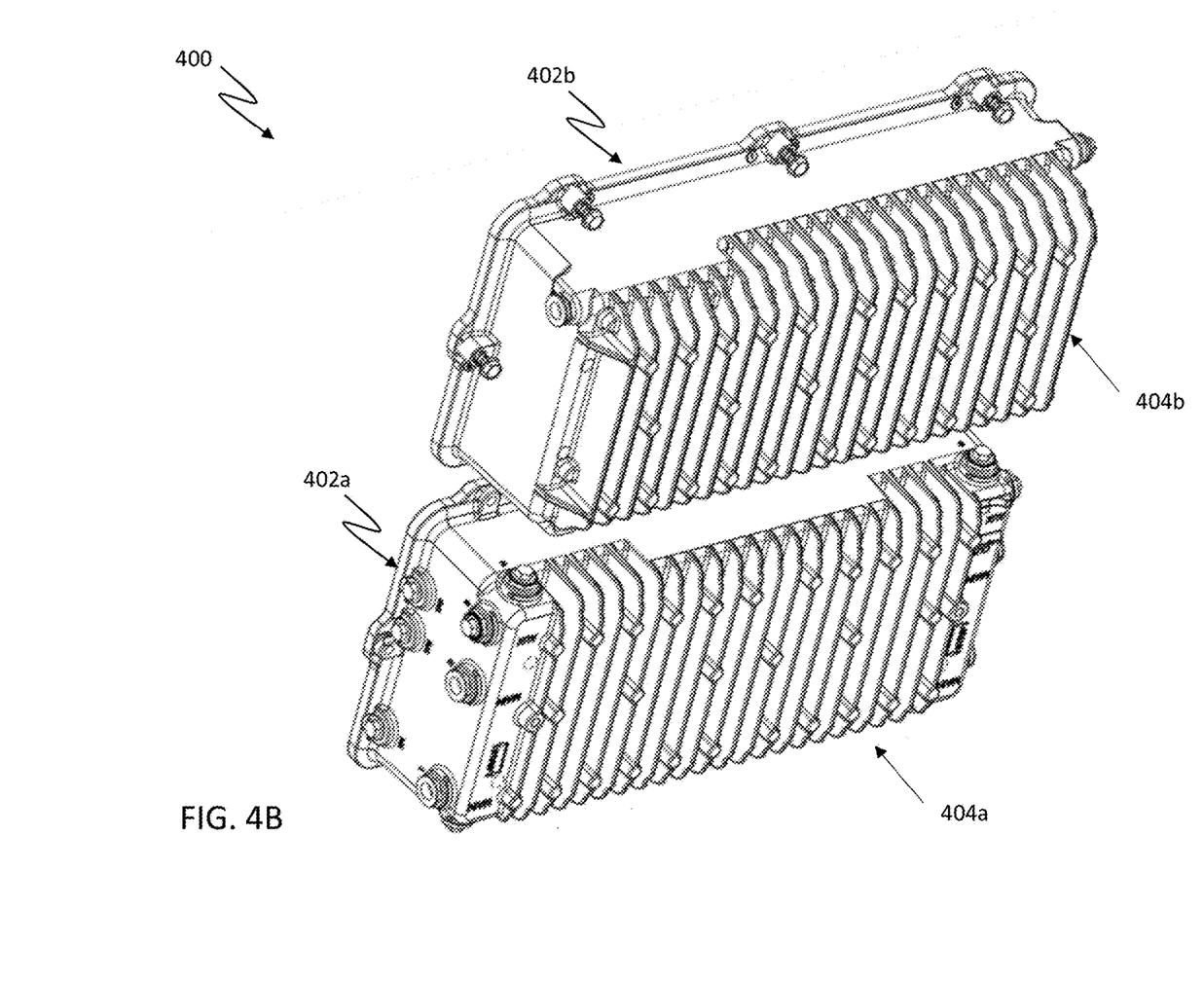
Figure 4C:
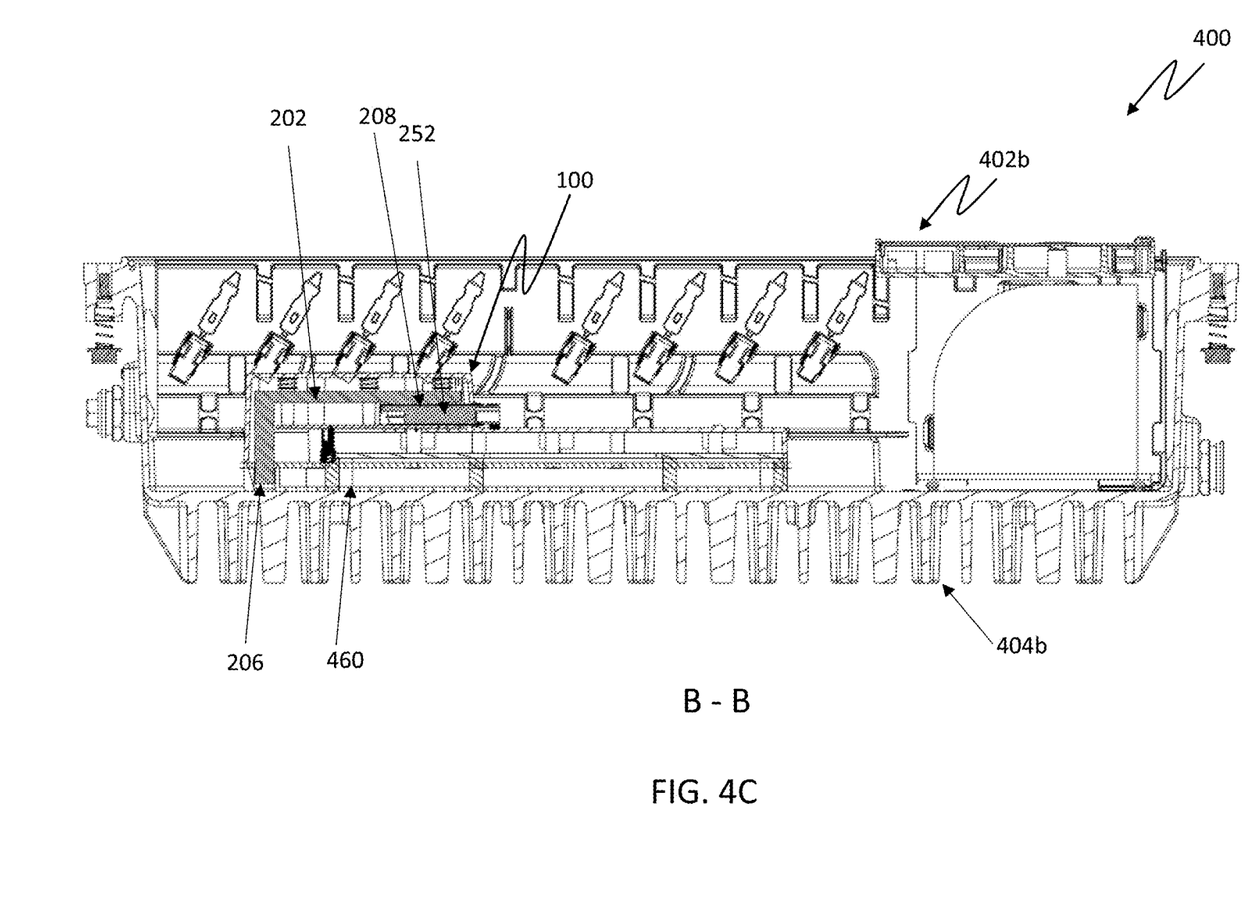

FIGS. 4A-4C are schematic diagrams of a communications node that includes an optical module in accordance with embodiments of the present disclosure. FIG. 4A is a schematic diagram of an interior isometric view of a communications node 400 in accordance with embodiments of the present disclosure. Communications node 400 is shown to be in an "open" position, revealing the internal components held by a first portion 402a and a second portion 402b portions of the communications node 400, such as optics module 100. Optics module 100 can interface with the interior of the node 400 such that a thermal conduction path is formed between the surface of the optics module 100 and the surface of the node 400. Heat fins 404a can be on the surface of the node 400 to provide passive cooling of the communications node and internal elements, such as the optics module and the SFP within the optics module (e.g., through the heat sink disclosed herein). Heat fins 404a are shown on one portion of the communications node 400, but it is understood that heat fins can be on both portions, as shown in FIG. 4B.

FIG. 4B shows heat fins on both portions of the exterior surfaces of the communications node. For example, the heat fins 404a are shown on node portion 402a. Heat fins 404b are also shown on the exterior surface of the second portion 402b of the communications node 400.

FIG. 4C is a schematic diagram of a cross sectional view of the communications node portion 402b in accordance with embodiments of the present disclosure. The cross section is taken through line B-B, as shown in FIG. 4A. The communications node portion 402b of communications node 400 includes the optics module 100. The heat sink 202 is shown to contact the thermal interface material 206 near the interface 460 between the surface of the optics module 106b and the inner surface of the node 400. In FIG. 4C, the SFP device 252 is shown to reside within the cage 208, with the heat sink in contact with the SFP device 252.

Heat fins 404*b* are also shown on the exterior of the node portion 402*b*. Heat fins 404*b* can passively cool the SFP device 252 via conductive path formed by the heat sink 202.

Figure 5:
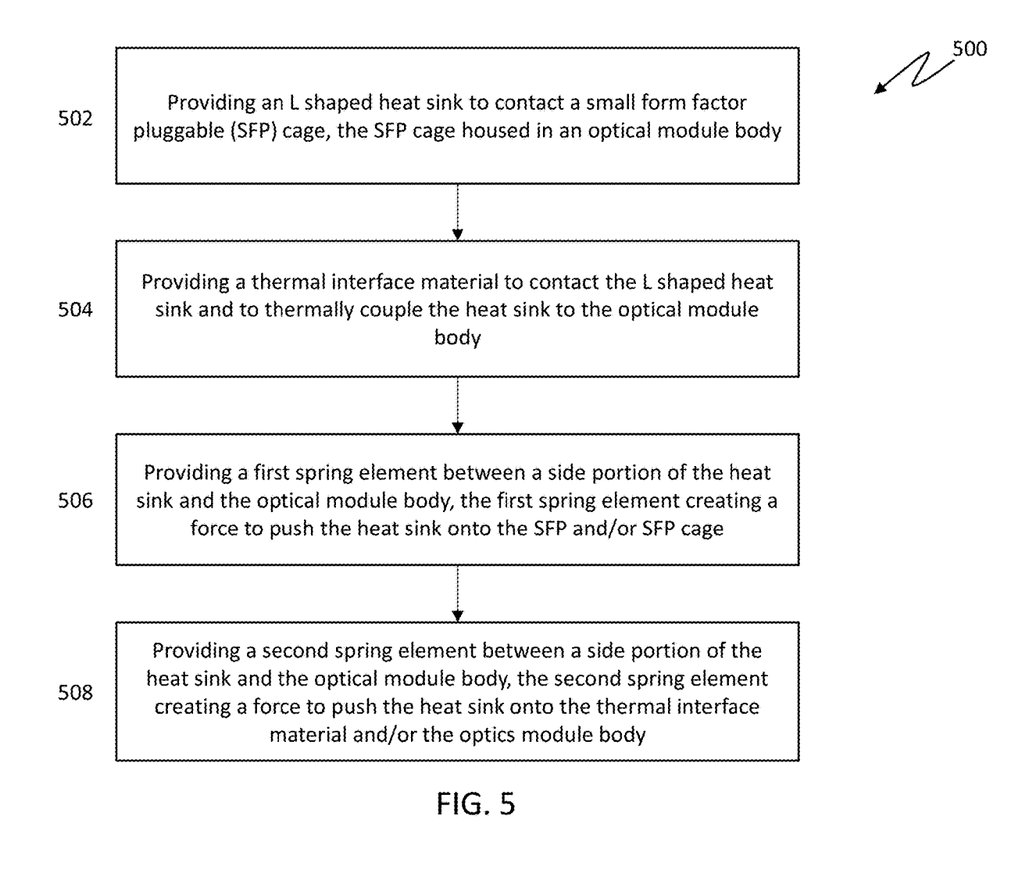
FIG. 5 is a process flow diagram for providing a heat sink in an optical module in accordance with embodiments of the present disclosure.

FIG. 5 is a process flow diagram 500 for providing a heat sink in an optical module in accordance with embodiments of the present disclosure. A heat sink can be provided and inserted into an optics module (502). The heat sink can have an L shape, where one part of the L contacts an SFP cage, while another second part of the L contacts the body of the optical module. In some embodiments, a thermal interface material can be provided (504). The thermal interface material can reside between the optics module body and the second part of the L shape of the heat sink. The thermal interface material can be used to ensure that the heat sink is tightly fit within the optics module and can be used to improve the contact from the heat sink to the optics module body (i.e., to thereby increase the thermal conductivity between the heat sink and the optics module body).

At least one springing element can be provided. The springing elements can be rigidly affixed to an inner wall of the optics module body and can contact the heat sink at at least one point on a top surface of the first portion of the heat sink L. The springing elements can push the heat sink onto the SFP, the SFP cage, the thermal interface material, and or the optics module body.

For example, a first springing element can be provided to push on the first portion of the heat sink L shape that contacts the SFP and/or SFP cage (506). A second springing element can be provided to push on the first portion of the heat sink L shape to push the second portion of the L shape onto the thermal interface material and/or the optics module body (508).

The optics module can include a motherboard or other remote physical printed circuit board (PCB). A notch in the motherboard can allow the second portion of the heat sink to pass through the PCB so that the thermal resistance of the PCB does not impact the conductive path formed between the SFP and the optics module via the heat sink.

Variations and Implementations

Within the context of the disclosure, a network referred to herein represents a series of points, nodes, or network elements of interconnected communication paths for receiving and transmitting packets of information that propagate through a network address translation system. A network offers communicative interfaces between sources, destinations, and intermediate nodes, and may be any local area network (LAN), wireless local area network (WLAN), virtual private network (VPN), or any other appropriate architecture or system that facilitates communications in a network environment depending on the network topology. A network can comprise any number of hardware and/or software elements coupled to (and in communication with) each other through a communication medium.

Communications in a network environment are referred to herein as 'network traffic' or 'traffic', which may be inclusive of packets. A packet is a formatted unit of data, and can contain both control information (e.g., source and destination addresses, etc.) and data, which is also known as payload. Network traffic can be sent and received according to any suitable communication messaging protocols. Suitable communication messaging protocols can include a multi-layered scheme such as Open Systems Interconnection (OSI) model, or any derivations or variants thereof (e.g., transmission control protocol/IP (TCP/IP), user datagram protocol/IP (UDP/IP), etc.). The term 'data' as used herein, refers to any type of binary, numeric, voice, video, textual, or script data, or any type of source or object code, or any other suitable information in any appropriate format that may be communicated from one point to another in electronic devices and/or networks. Additionally, messages, requests, responses, replies, queries, etc. are forms of network traffic, and therefore, may comprise packets.

Nodes, service nodes, and a controller of a communication system described herein can be network elements in network environment. As used herein, the term 'network element' is meant to encompass routers, switches, gateways, bridges, load balancers, service appliances, firewalls, servers, processors, modules (any of which may be physical or virtually implemented on physical hardware) or any other suitable device, component, element, proprietary appliance, or object that is operable to exchange information in a network environment. A network element may include any suitable hardware, software, components, modules, interfaces, or objects that facilitate the operations thereof. This may be inclusive of appropriate algorithms and communication protocols that allow for the effective exchange of data or information.

In at least one example implementation, network elements with triggered in-band OAM capabilities described herein include logic to achieve (or to foster) the activities as outlined herein. Note that in at least one example, each of these elements can have an internal structure (e.g., processors, memory elements, network interface cards, etc.) to facilitate some of the operations described herein. In some embodiments, these activities may be executed externally to these elements, or included in some other network element to achieve this intended functionality. In at least one embodiment these network elements may include logic (or reciprocating logic) that can coordinate with other network elements in order to achieve the operations, as outlined herein. Furthermore, one or several devices may include any suitable algorithms, hardware, firmware, software, components, modules, interfaces, or objects that facilitate the operations thereof.

In certain example implementations, the triggered in-band OAM capabilities outlined herein may be implemented by logic encoded in at least one tangible media (e.g., embedded logic provided in an application specific integrated circuit (ASIC), digital signal processor (DSP) instructions, software (potentially inclusive of object code and source code) to be executed by at least one processor or other similar machine, instructions in software, hardware, firmware, or any combination thereof, etc.). This tangible media may be non-transitory in at least one embodiment. In some of these instances, at least one memory element can store data used for the operations described herein. This includes the memory elements being able to store software, logic, code, and/or processor instructions that are executed to carry out the activities described herein. A processor can execute any type of instructions associated with the data to achieve the operations detailed herein. In one example, a processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable ROM (EEPROM)) or an ASIC that includes digital logic, software, code, electronic instructions, or any suitable combination thereof.

Any of these network elements can include memory for storing information to be used in achieving the triggered in-band OAM capabilities, as outlined herein. Additionally, these network elements may include at least one processor that can execute software, an algorithm, or other instructions to perform the triggered in-band OAM operations, as disclosed herein. These network elements may further keep information, to be used in achieving the triggered in-band OAM capabilities as discussed herein, in any suitable memory element (ternary content addressable memory (TCAM), random access memory (RAM), read only memory (ROM), EPROM, EEPROM, ASIC, etc.), software, hardware, or in any other suitable component, device, element, or object where appropriate and based on particular needs. Any of the memory items discussed herein (e.g., repositories, stores, databases, tables, caches, buffers, etc.) should be construed as being encompassed within the broad term 'memory element.' Similarly, any of the potential processing elements, modules, and machines described herein should be construed as being encompassed within the broad term 'processor.' Each of the network elements can also include suitable interfaces for receiving, transmitting, and/or otherwise communicating data or information in a network environment.

Note that with the examples provided herein, interaction may be described in terms of two, three, or more network elements. However, this has been done for purposes of clarity and example only. In certain cases, it may be easier to describe at least one of the functionalities of a given set of flows by only referencing a limited number of network elements. It should be appreciated that the systems described herein are readily scalable and can accommodate a large number of components, as well as more complicated/sophisticated arrangements and configurations. Accordingly, the examples provided should not limit the scope or inhibit the broad teachings of the various embodiments of triggered in-band OAM as potentially applied to a myriad of other architectures or implementations.

As used herein, unless expressly stated to the contrary, use of the phrase 'at least one of' refers to any combination of the named elements, conditions, or activities. For example, 'at least one of X, Y, and Z' is intended to mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z. Additionally, unless expressly stated to the contrary, the terms 'first', 'second', 'third', etc., are intended to distinguish the particular nouns (e.g., element, condition, module, activity, operation, etc.) they modify. Unless expressly stated to the contrary, the use of these terms is not intended to indicate any type of order, rank, importance, temporal sequence, or hierarchy of the modified noun. For example, 'first X' and 'second X' are intended to designate two separate X elements that are not necessarily limited by any order, rank, importance, temporal sequence, or hierarchy of the two elements.

It is also important to note that the activities, interactions, and operations shown and described herein illustrate only some of the possible interoperability scenarios and patterns that may be executed by, or within, the nodes with triggered in-band OAM capabilities. Some of these activities, interactions, and/or operations may be deleted or removed where appropriate, or may be modified or changed considerably without departing from the scope of the present disclosure. In addition, a number of these activities, interactions, and/or operations have been described as being executed concurrently with, or in parallel to, at least one additional activity, interactions, and/or operations. However, the timing of these activities, interactions, and/or operations may be altered considerably. The preceding operational flows have been offered for purposes of example and discussion. Substantial flexibility is provided by network elements with triggered in-band OAM capabilities in that any suitable arrangements, chronologies, configurations, and timing mechanisms may be provided without departing from the teachings of the present disclosure. Additionally, these activities can be facilitated by various modules and/or components which can be suitably combined in any appropriate manner, or partitioned in any appropriate manner, and which may be based on particular configuration and/or provisioning needs.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although embodiments herein have been illustrated with reference to particular elements and protocols, these elements and protocols may be replaced by any suitable architecture, protocols, and/or processes that achieve the intended functionality of triggered in-band OAM as disclosed herein.

What is claimed is:

1. An optics module comprising a top-side inner wall and a bottom-side inner wall, the optics module comprising:
   a receiving element for receiving a small form factor pluggable (SFP) device;
   an L-shaped heat sink comprising a first portion, the first portion comprising a top side and a bottom side, the bottom side of the L-shaped heat sink in contact with the receiving element; and
   a first springing element residing between and in contact with the first portion of the and the top-side inner wall of the optics module, the first springing element configured to bias the top side of the first portion of the L-shaped heat sink onto the receiving element.

2. The optics module of claim 1, wherein the L-shaped heat sink further comprises a second portion, and wherein the optics module comprises a second springing element residing between the top-side inner wall of the optics module and the top side of the first portion of the L-shaped heat sink, the second springing element configured to bias the second portion of the L-shaped heat sink onto the bottom-side inner wall of the optics module.

3. The optics module of claim 2, further comprising a thermal interface material residing between the bottom-side inner wall of the optics module and the second portion of the L-shaped heat sink, the thermal interface material configured to establish a thermal conduction path between the bottom-side inner wall of the optics module and the L-shaped heat sink.

4. The optics module of claim 3, wherein the second springing element configured to bias the second portion of the L-shaped heat sink onto the thermal interface material.

5. The optics module of claim 3, wherein the thermal interface material comprises a thermally conductive material.

6. The optics module of claim 2, wherein the first portion of the L-shaped heat sink is a first leg of the L-shaped heat sink and the second portion of the L-shaped heat sink is a second leg of the L-shaped heat sink.

7. The optics module of claim 2, further comprising a thermal interface material residing between the heat sink and the bottom-side inner wall of the optics module, and wherein the second springing element configured to bias the L-shaped heat sink onto the thermal interface material.

8. The optics module of claim 2, wherein the optics module the first and second springing elements each comprise one of a spring, a rubber grommet, or a rubber bellow.

9. The optics module of claim 1, further comprising the SFP device residing in the receiving element; and wherein:
the L-shaped heat sink comprises a protrusion on the bottom side of the L-shaped heat sink, the receiving element comprises a gap to receive the protrusion to contact the SFP device within the receiving element.

10. The optics module of claim 1, wherein the optics module comprises a bottom-side outer wall, the optics module further comprising at least one attachment element thermally coupled to the bottom-side inner wall of the optics module, the L-shaped heat sink forming a thermal conduction path between the SFP cage and the at least one attachment element on the bottom-side outer wall of the optics module.

11. The optics module of claim 1, wherein the L-shaped heat sink comprises one of copper or aluminum.

12. A communications node comprising:
a housing, the housing comprising an outer surface the outer surface comprising at least one passive cooling element;
the housing further comprising an inner surface, the inner surface configured to receiving an optics module; and
the optics module comprising a top-side inner wall and a bottom-side inner wall, the optics module comprising:
a receiving element for receiving a small form factor pluggable (SFP) device;
an L-shaped heat sink comprising a first portion, the first portion comprising a top side and a bottom side, the bottom side of the L-shaped heat sink in contact with the receiving element; and
a first springing element residing between and in contact with the first portion of the and the top-side inner wall of the optics module, the first springing element configured to bias the top side of the first portion of the L-shaped heat sink onto the receiving element, and
wherein the optics module comprises a bottom-side outer wall, the optics module further comprising at least one attachment element thermally coupled to bottom-side inner wall of the optics module, the L-shaped heat sink forming a thermal conduction path between a cage of the SFP device and the at least one attachment element on the bottom-side outer wall of the optics module;

wherein the housing is configured to receive the at least one attachment element at the inner surface and wherein the inner surface of the housing forms a conductive path between the at least one attachment element and the at least one passive cooling element on the outer surface of the housing.

13. The communications node of claim 12, wherein the L-shaped heat sink further comprises a second portion, and wherein the optics module comprises a second springing element residing between the top-side inner wall of the optics module and the top side of the first portion of the L-shaped heat sink, the second springing element configured to bias the second portion of the L-shaped heat sink onto the bottom-side inner wall of the optics module.

14. The communications node of claim 13, further comprising a thermal interface material residing between the bottom-side inner wall of the optics module and the second portion of the L-shaped heat sink, the thermal interface material configured to establish a thermal conduction path between the bottom-side inner wall of the optics module and the L-shaped heat sink.

15. The communications node of claim 14, wherein the second springing element configured to bias the second portion of the L-shaped heat sink onto the thermal interface material.

16. The communications node of claim 14, wherein the thermal interface material comprises a thermally conductive material.

17. The communications node of claim 13, wherein the first portion of the L-shaped heat sink is a first leg of the L-shaped heat sink and the second portion of the L-shaped heat sink is a second leg of the L-shaped heat sink.

18. The communications node of claim 13, further comprising a thermal interface material residing between the L-shaped heat sink and the bottom-side inner wall of the optics module, and wherein the second springing element configured to bias the L-shaped heat sink onto the thermal interface material.

19. The communications node of claim 12, further comprising the SFP device residing in the receiving element; and wherein: the L-shaped heat sink further comprises a protrusion on the bottom side of the L-shaped heat sink, the receiving element comprises a gap to receive the protrusion to contact the SFP device within the receiving element.

20. The communications node of claim 12, wherein the at least one passive cooling element comprises at least one heat fin on the outer surface of the housing of the communication node.

\* \* \* \* \*